US012610840B2

(12) United States Patent
Itoi et al.

(10) Patent No.: US 12,610,840 B2
(45) Date of Patent: Apr. 21, 2026

(54) METHOD FOR MANUFACTURING SEMICONDUCTOR DEVICE INCLUDING FORMING OPENING IN RESIST OF THE SEMICONDUCTOR DEVICE

(71) Applicant: Panasonic Intellectual Property Management Co., Ltd., Osaka (JP)

(72) Inventors: Kiyokazu Itoi, Osaka (JP); Keiko Ikuta, Osaka (JP); Daisuke Sakurai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 633 days.

(21) Appl. No.: 17/821,726

(22) Filed: Aug. 23, 2022

(65) Prior Publication Data

US 2023/0089483 A1      Mar. 23, 2023

(30) Foreign Application Priority Data

Sep. 21, 2021      (JP) ................................. 2021-152822

(51) Int. Cl.
H01L 23/00      (2006.01)
H10W 72/00      (2026.01)
H10W 72/20      (2026.01)

(52) U.S. Cl.
CPC ......... H10W 72/012 (2026.01); H10W 72/20 (2026.01); H10W 72/01235 (2026.01);
(Continued)

(58) Field of Classification Search
CPC ......... H01L 24/11; H01L 24/13; H01L 24/10; H01L 2224/11462; H01L 2224/11515;
(Continued)

(56) References Cited

U.S. PATENT DOCUMENTS 6,309,580 B1 * 10/2001  Chou ...................... B29C 33/60
                                                        216/53
2004/0124566 A1 * 7/2004  Sreenivasan .......... B81C 1/0046
                                                        264/494

(Continued)

FOREIGN PATENT DOCUMENTS

JP          2005-533393          11/2005
JP          2006-26873          2/2006
(Continued)

OTHER PUBLICATIONS

Yu, Chen-Chieh, et al., "Nanoimprint technology for patterning functional materials and its applications", Microelectronic Engineering 132, pp. 98-119 (Year: 2015).*

*Primary Examiner* — Karen Kusumakar
(74) *Attorney, Agent, or Firm* — Wenderoth, Lind & Ponack, L.L.P.

(57)      ABSTRACT

A method for manufacturing a semiconductor device includes providing a semiconductor element having electrode terminals; forming a resist on the semiconductor element, the resist having a first surface facing the electrode terminals and a second surface opposite to the first surface; forming an opening in the resist, which covers the electrode terminals by inserting protrusions of a mold into the resist above the electrode terminals; curing the resist by applying energy to the resist; and widening the opening in a radial direction of the opening. The resist is cured in a state where the second surface of the resist faces an inner surface of the mold with a gap between the second surface of the resist and the inner surface of the mold.

10 Claims, 4 Drawing Sheets

(52) U.S. Cl.
CPC ............................ *H10W 72/01251* (2026.01);
*H10W 72/01261* (2026.01); *H10W 72/221*
(2026.01); *H10W 72/223* (2026.01); *H10W*
*72/234* (2026.01)

(58) Field of Classification Search
CPC . H01L 2224/11602; H01L 2224/11618; H01L
2224/11901; H01L 2224/13005; H01L
2224/13019; H01L 2224/1357; H01L
2924/3511; H01L 2924/37001; H01L
2924/381; H01L 2924/3841
See application file for complete search history.

(56) References Cited

U.S. PATENT DOCUMENTS

2010/0029084 A1\*  2/2010  Koshiba ................. B82Y 40/00
156/345.24
2019/0181110 A1  6/2019  Sakurai et al.

FOREIGN PATENT DOCUMENTS

| | | | |
|---|---|---|---|
| JP | 2006-165240 | 6/2006 | |
| JP | 2013-069921 | 4/2013 | |
| JP | 2019-102763 | 6/2019 | |
| JP | 2019-197780 | 11/2019 | |
| JP | 2021-034628 A \* | 3/2021 | .......... H01L 2224/11 |
| KR | 10-2005-0024324 | 3/2005 | |
| WO | 2004/016406 | 2/2004 | |

\* cited by examiner

METHOD FOR MANUFACTURING SEMICONDUCTOR DEVICE INCLUDING FORMING OPENING IN RESIST OF THE SEMICONDUCTOR DEVICE

BACKGROUND

1. Technical Field

The present disclosure relates to a method for manufacturing a semiconductor device and a semiconductor device.

2. Description of the Related Art

In recent years, in order to achieve both densification of a semiconductor element and an increase in the number of pins of the electrode terminals, a pitch between the electrode terminals of the semiconductor element has been narrowed and an area of the electrode terminals has been reduced. Flip-chip mounting has been known as one of a plurality of techniques for mounting the semiconductor element in which the pitch between the electrode terminals is narrowed and the area of the electrode terminals is reduced on a mounting substrate.

In the flip-chip mounting, a protrusion electrode is formed on the electrode terminal of the semiconductor element such as a system LSI, a memory, or a CPU, and is pressed and heated against a connection terminal of the mounting substrate. Accordingly, the electrode terminal is bump-connected to the connection terminal, and the semiconductor element is flip-chip mounted on the mounting substrate.

Many solder bumps are adopted for the protrusion electrode formed on the electrode terminal. As a method for forming the solder bump on the electrode terminal in a protrusion shape, for example, a method for forming solder on the electrode terminal by screen printing, dispensing, or electrolytic plating and then heating the solder to a solder melting point or higher in a reflow furnace has been known.

However, as the pitch between the electrode terminals is narrowed, the melted and deformed solder bump is connected to the other solder bump due to a surface tension in a pressing and heating step at the time of the flip-chip mounting, and a bridge failure is likely to occur. Accordingly, as a demand for narrowing the pitch between the electrode terminals is tougher, it becomes more difficult to adopt the solder bump for the protrusion electrode.

Thus, a method for adopting a tapered fine metal bump made of, for example, gold or copper instead of the solder bump for the protrusion electrode formed on the electrode terminal has been known. In this method, in the pressing and heating step at the time of the flip-chip mounting, a distal end of the protrusion electrode is plastically deformed, and the protrusion electrode is bonded to the connection terminal by solid-phase diffusion. According to this method, since the tapered fine metal bump is not melted in the pressing and heating step at the time of the flip-chip mounting, the occurrence of the bridge failure can be prevented. Accordingly, it is also easy to cope with the narrowing of the pitch between the electrode terminals.

Unexamined Japanese Patent Publication No. 2019-197780 discloses a method for forming a conical fine metal bump having an inclined surface. This method includes providing an opening in a resist formed on an electrode terminal by using a sheet-like imprint mold, and filling the opening with metal.

CITATIONS LIST

Patent Literature

PTL 1: Unexamined Japanese Patent Publication No. 2019-197780

SUMMARY

A method for manufacturing a semiconductor device according to an aspect of the present disclosure includes providing a semiconductor element having an electrode terminal, forming a resist on the semiconductor element, the resist having a first surface facing the electrode terminal and a second surface opposite to the first surface, providing an imprint mold having a third surface and a protrusion protruding from the third surface, forming an opening in the resist by disposing the imprint mold on the second surface of the resist and inserting the protrusion into the resist, the third surface of the imprint mold facing the second surface of the resist, the protrusion being aligned with the electrode terminal, curing the resist by applying energy to the resist, widening the opening in a radial direction of the opening by causing the resist to react with a developer, forming a bump by filling the opening with metal, and peeling off the resist from the electrode terminal, in which the forming of the opening in the resist is performed in a state where a gap is provided between the second surface of the resist and the third surface of the imprint mold.

A semiconductor device according to another aspect of the present disclosure includes a semiconductor element having an electrode terminal, a bump that is formed on the electrode terminal, and has a base end, a distal end opposite to the base end, and an intermediate portion between the base end and the distal end, in which the bump has a tapered portion that is positioned between the base end and the intermediate portion and is narrowed from the base end toward the intermediate portion, and a reverse tapered portion that is positioned between the intermediate portion and the distal end and is thickened from the intermediate portion toward the distal end, and the intermediate portion becomes a recessed portion.

DETAILED DESCRIPTION

In the method disclosed in Unexamined Japanese Patent Publication No. 2019-197780, the conical bump having the inclined surface can be formed on the surface of the electrode terminal. However, when the semiconductor element in which the bump is formed is flip-chip mounted on the substrate, since a pressure at the time of flip-chip mounting is applied to the mounting substrate via the bump, stress is applied to a device or the like formed on the mounting substrate, and as a result, there is a problem that reliability or the like of the device is impaired.

The present disclosure has been made in view of the above problem, and a main object of the present disclosure is to provide a method for manufacturing a semiconductor device and a semiconductor device capable of alleviating stress applied to a mounting substrate side when a semiconductor element including an electrode terminal is flip-chip mounted on the mounting substrate.

Hereinafter, an exemplary embodiment of the present disclosure will be described in detail with reference to the drawings. Note that the present disclosure is not limited to the following exemplary embodiment. Furthermore, modifications can be made as appropriate without departing from the scope within which the effects of the present disclosure are exhibited.

FIGS. 1A to 1J are cross-sectional views schematically illustrating a method for manufacturing a semiconductor device according to the exemplary embodiment of the present disclosure.

First, semiconductor element 1 having a plurality of electrode terminals 2 is provided.

Figure 1A:
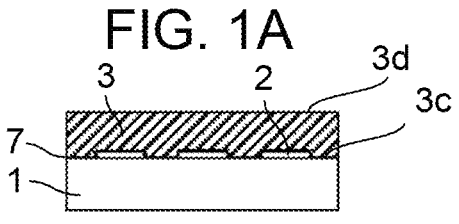
FIG. 1A is a cross-sectional view schematically illustrating a method for manufacturing a semiconductor device according to an exemplary embodiment of the present disclosure.

Next, a resist forming step illustrated in FIG. 1A will be described. Semiconductor element 1 has an upper surface on which a plurality of electrode terminals 2 are formed.

Semiconductor element 1 is formed on, for example, a circular silicon wafer. An outer diameter of the silicon wafer is, a diameter of, for example, 300 mm.

In the resist forming step, seed layer 7 is formed so as to cover the entire upper surface. Seed layer 7 is a thin conductive layer and is used as an electrode in a metal filling process. When the metal filling process is an electroplating forming process, seed layer 7 is also used as an underlayer for forming electroplating. A material of seed layer 7 may be, for example, Ni, W, Cr, Cu, Co, Ti, or the like. A thickness of seed layer 7 may be, for example, 0.02 μm to 2 μm.

After seed layer 7 is formed, a resist 3 is formed on seed layer 7. Resist 3 may be, for example, a photosensitive type, a thermosetting type, or a photo-thermal combined type resist. A film of resist 3 is uniformly formed by using, for example, spin coating, bar coating, spraying, jet dispensing, or the like. Resist 3 has first surface 3c facing electrode terminal 2 and second surface 3d opposite to first surface 3c.

Imprint mold 5 is provided. Imprint mold 5 has inner surface (third surface) 5c and a plurality of protrusions 5a protruding from inner surface 5c. Imprint mold 5 is a transfer mold in which the plurality of protrusions 5a are provided at predetermined intervals so as to face the plurality of electrode terminals 2. A shape of protrusion 5a may be, for example, a circle, a quadrangle, or an octagon.

Figure 1B:
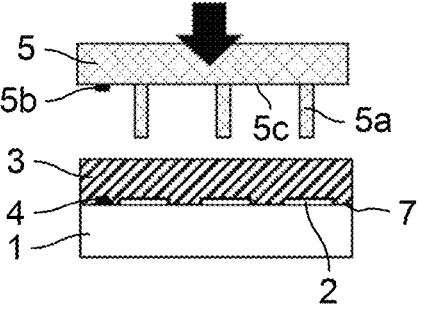
FIG. 1B is a cross-sectional view schematically illustrating the method for manufacturing a semiconductor device according to the exemplary embodiment of the present disclosure.

Next, a resist opening step illustrated in FIGS. 1B and 1C will be described. First, as illustrated in FIG. 1B, recognition mark 5b provided in imprint mold 5 and recognition mark 4 provided in semiconductor element 1 are aligned. Imprint mold 5 is disposed on second surface 3d of resist 3 such that inner surface 5c of imprint mold 5 faces second surface 3d of resist 3 and protrusions 5a are aligned with electrode terminals 2.

Imprint mold 5 may be made of, for example, one of quartz, glass, and silicone resin, or may be formed by stacking a plurality of materials. For example, since warpage and undulation of semiconductor element 1 can be absorbed, a flexible silicone resin is suitably used for a surface of imprint mold 5.

Imprint mold 5 may be formed, for example, by preparing an original plate and then causing the material of imprint mold 5 to flow and curing the material. Here, the original plate to be prepared has a plurality of recesses having a dimension equal to an opening diameter of opening 3a at an interval equal to an interval between a plurality of openings 3a (see FIG. 1E) formed in resist 3. The original plate may be formed by, for example, etching or electrical discharge machining silicon, quartz, or glass. An external dimension of imprint mold 5 is larger than an external dimension of semiconductor element 1. The shape of imprint mold 5 is, for example, a rectangle.

Figure 1C:
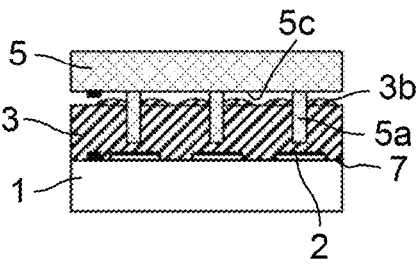
FIG. 1C is a cross-sectional view schematically illustrating the method for manufacturing a semiconductor device according to the exemplary embodiment of the present disclosure.

Subsequently, as illustrated in FIG. 1C, protrusions 5a are inserted into resist 3 by pressurization of imprint mold 5. At this time, a distal end of protrusion 5a may be in contact with electrode terminal 2 or may be slightly away from electrode terminal 2. Furthermore, a gap is provided between second surface 3d of resist 3 and inner surface 5c of imprint mold 5. Accordingly, since a contact area between resist 3 and imprint mold 5 is reduced, it is possible to prevent seed layer 7 and resist 3 from being peeled off, which occurs when imprint mold 5 is pulled up.

Furthermore, resist 3 pressed by protrusions 5a escapes into the gap between imprint mold 5 and resist 3, and forms raised portion 3b along an opening peripheral edge of opening 3a. Accordingly, resist 3 is prevented from flowing in a lateral direction. Accordingly, imprinting (resist opening step) can be performed by a step-and-repeat method without breaking a shape of resist 3 on adjacent semiconductor elements. As a result, patterning accuracy and alignment accuracy can be improved as compared with a batch method. Of course, the resist opening step may be performed by the batch method.

Subsequently, in a resist curing step illustrated in FIG. 1D, energy 12 with which resist 3 reacts is applied via imprint mold 5 while protrusions 5a of imprint mold 5 are inserted into resist 3. For example, resist 3 is irradiated with light (for example, ultraviolet light) 12 via imprint mold 5, and is then heated. Here, since resist 3 can react with light irradiated via imprint mold 5, imprint mold 5 has suitably light transmissivity with respect to light having a wavelength with which resist 3 reacts. Imprint mold 5 is made of a material having light transmissivity, such as quartz, glass, or a transparent silicone resin.

Figure 1D:
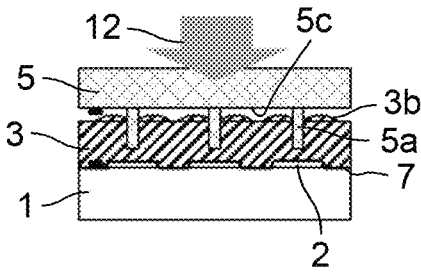
FIG. 1D is a cross-sectional view schematically illustrating the method for manufacturing a semiconductor device according to the exemplary embodiment of the present disclosure.
Figure 1E:
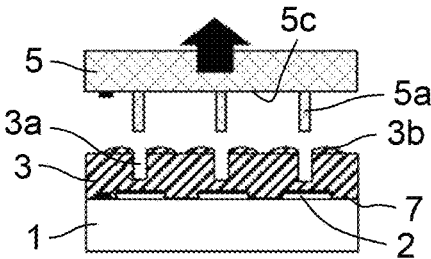
FIG. 1E is a cross-sectional view schematically illustrating the method for manufacturing a semiconductor device according to the exemplary embodiment of the present disclosure.

Subsequently, as illustrated in FIG. 1E, imprint mold 5 is pulled up. By doing this, fine openings 3a are formed in resist 3. Here, since mold releasability after the resist is cured is improved, the material of imprint mold 5 and the material of resist 3 have suitably a solubility parameter of, for example, 2.0 or more. For example, when a silicone resin having a solubility parameter of 7.3 to 7.6 is used for imprint mold 5, an acrylic resin having a solubility parameter of 9.5 to 12.5, an epoxy resin having a solubility parameter of 10.9 to 11.2, or the like may be used as the material of resist 3. Furthermore, since the mold releasability is further improved, a mold release film is suitably made of a light-transmissive metal or resin on the surface of imprint mold 5. For example, nickel, indium tin oxide, silicone rubber, fluororubber, or the like is used as the mold release film.

Note that, in the present exemplary embodiment, although energy 12 is applied to resist 3 via imprint mold 5 while protrusion 5a of imprint mold 5 is inserted into resist 3, before energy 12 is applied to resist 3, imprint mold 5 may be pulled up, and energy 12 may be directly applied to resist 3 in a state where opening 3a is formed (see FIG. 1E).

Figure 1F:
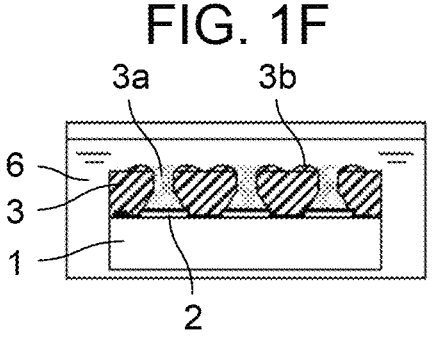
FIG. 1F is a cross-sectional view schematically illustrating the method for manufacturing a semiconductor device according to the exemplary embodiment of the present disclosure.

Subsequently, in a development step illustrated in FIG. 1F, semiconductor element 1 is immersed in a developer in developer tank 6. The developer in developer tank 6 enters opening 3a, and thus, dissolution of an inner wall of opening 3a of resist 3 proceeds, and opening 3a expands in a radial direction. Here, the developer in developer tank 6 has an action of dissolving resist 3. The developer in developer tank 6 may be, for example, a tetramethylammonium hydroxide or trimethyl (2-hydroxyethyl) ammonium hydroxide aqueous solution.

As described above, opening 3a is formed by imprint mold 5. As illustrated in FIG. 1E, opening 3a is vertically opened, and is provided so as to have the same shape over entire semiconductor element 1. The developer can enter opening 3a at a uniform speed in a surface of semiconductor element 1. Thereafter, the dissolution of resist 3 progresses according to a degree of crosslinking of resist 3. Since a portion of resist 3 having a low degree of crosslinking dissolves faster than a portion of resist 3 having a high degree of crosslinking, a shape of opening 3a can be controlled by controlling the degree of crosslinking of resist 3. The control of the degree of crosslinking of resist 3 will be described later.

Figure 1G:
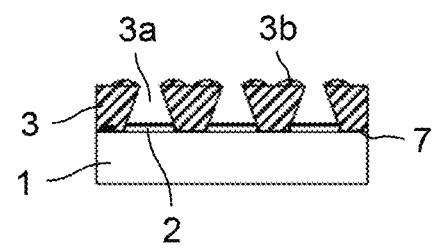
FIG. 1G is a cross-sectional view schematically illustrating the method for manufacturing a semiconductor device according to the exemplary embodiment of the present disclosure.

Subsequently, as illustrated in FIG. 1G, the developer and a residue entering opening 3a are removed by a cleaning liquid. The cleaning liquid is, for example, pure water, alcohol, ethanol, or acetone.

Figure 1H:
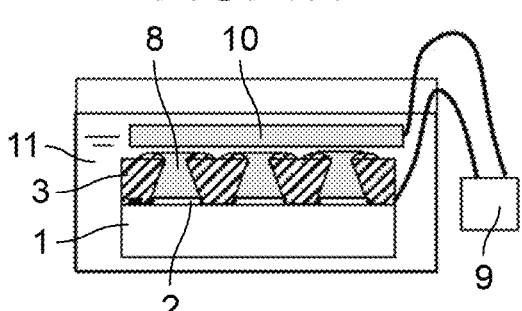
FIG. 1H is a cross-sectional view schematically illustrating the method for manufacturing a semiconductor device according to the exemplary embodiment of the present disclosure.

Subsequently, in a metal filling step (plating step) illustrated in FIG. 1H, seed layer 7 and electrode 10 of semiconductor element 1 are connected to power supply 9, are immersed in electrolytic plating bath 11, and are subjected to an energization treatment. As a result, opening 3a is filled with metal serving as a bump. A plating solution may be, for example, a bottom-up type filled plating solution containing Cu, Co, Au, or the like. Since wettability to the inner wall of opening 3a is increased by a catalytic effect of Cu, Co, Au, or the like and injection of the plating solution is facilitated even in the case of minute opening 3a, these plating solutions are suitably used for forming plating in a bottom-up manner.

Figure 1I:
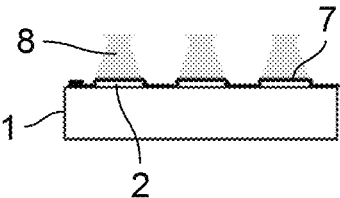
FIG. 1I is a cross-sectional view schematically illustrating the method for manufacturing a semiconductor device according to the exemplary embodiment of the present disclosure.

Subsequently, in a resist peeling step illustrated in FIG. 1I, resist 3 is immersed in a resist peeling solution and is peeled off from semiconductor element 1.

Figure 1J:
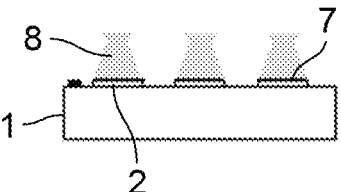
FIG. 1J is a cross-sectional view schematically illustrating the method for manufacturing a semiconductor device according to the exemplary embodiment of the present disclosure.

Finally, in a seed layer removal step illustrated in FIG. 1J, when seed layer 7 is removed by wet etching or ashing treatment, a tapered bump (protrusion electrode) 8 having an inclined surface is formed. Here, since an etching amount of bump 8 can be reduced in the seed layer removal step and a bump shape after the resist peeling step can be maintained, a material having an etching rate higher than an etching rate of bump 8 is suitably used for seed layer 7. Seed layer 7 under bump 8 remains as a conductive film.

In the present exemplary embodiment, the shape of bump 8 can be controlled by controlling an energization treatment time in the metal filling step (plating step). Specifically, as illustrated in FIG. 1H, bump 8 having a shape illustrated in FIG. 2 can be formed by filling metal up to raised portion (3b).

Figure 2:
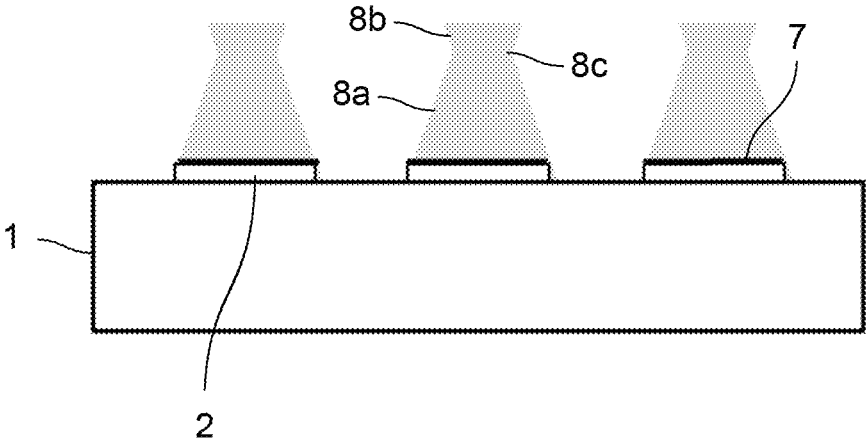
FIG. 2 is a cross-sectional view illustrating a bump shape.

Bump 8 illustrated in FIG. 2 has tapered portion 8a whose width decreases from electrode terminal 2 side and reverse tapered portion 8b whose width increases from tapered portion 8a side, and a space between tapered portion 8a and the reverse tapered portion is recessed portion 8c. Accordingly, when semiconductor element 1 is flip-chip mounted on a mounting substrate, a pressure applied to a mounting substrate side via bump 8 can be absorbed by recessed portion 8c. As a result, stress applied to a device or the like formed on the mounting substrate can be alleviated, and deterioration in reliability or the like of the device can be suppressed.

<Control of Degree of Crosslinking of Resist>

Figure 3A:
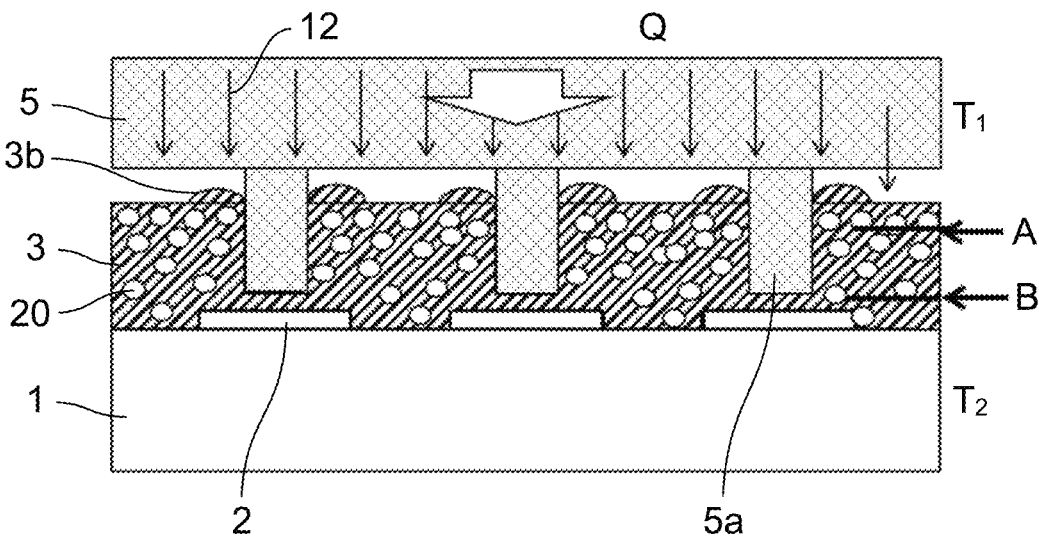
FIG. 3A is a diagram illustrating control of a degree of crosslinking of a resist.

FIG. 3A is an enlarged view of the step illustrated in FIG. 1D.

As illustrated in FIG. 3A, light reception amounts of position A and position B of resist 3 when ultraviolet light 12 having light amount Q is emitted via imprint mold 5 are indicated by $Q_A$ and $Q_B$, respectively.

Figure 3B:
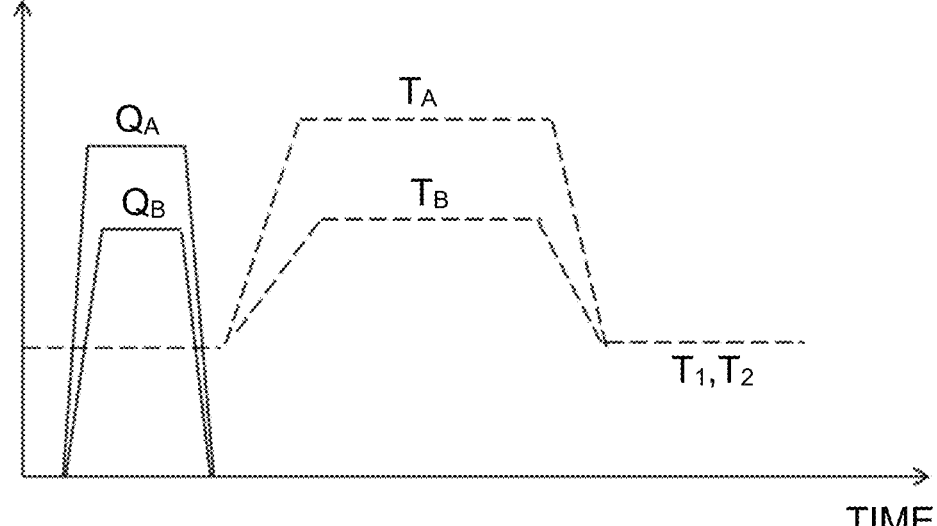
FIG. 3B is a diagram illustrating control of a crosslinking degree of a resist.

As illustrated in FIG. 3B, ultraviolet light 12 having light reception amounts $Q_A$ and $Q_B$ are received at position A and position B of resist 3, respectively, for a certain period of time. Since the light reception amount decreases as a distance from imprint mold 5 increases, $Q_A$ becomes larger than $Q_B$. At this time, temperatures at position A and position B of resist 3, temperature $T_1$ of imprint mold 5, and temperature $T_2$ of semiconductor element 1 are equal and constant. When a light transmittance of imprint mold 5 is lower than a light transmittance of resist 3 in a wavelength range in which resist 3 reacts, a degree of crosslinking around the opening of resist 3 by protrusions 5a in irradiation with ultraviolet light 12 is suitably controlled.

Subsequently, temperature $T_1$ of imprint mold 5 illustrated in FIG. 3A is increased to a temperature equal to or higher than temperature $T_2$ of semiconductor element 1, and is maintained for a certain period of time. From imprint mold 5 whose temperature is increased, heat is transferred to resist 3 by thermal radiation, and the heat is transferred from position A to position B of resist 3 at a gentle speed.

On the other hand, when a mounting stage (not illustrated) on which semiconductor element 1 is mounted acts as a heat sink that releases heat, position B of resist 3 close to semiconductor element 1 continues to be constantly cooled via semiconductor element 1 having high thermal conductivity. As a result, temperature $T_A$ at position A of resist 3 when the temperature of imprint mold 5 increases is higher than temperature $T_B$ at position B of resist 3.

By the irradiation of ultraviolet light 12 and the temperature increase of imprint mold 5, a light reception amount and a heat amount in a thickness direction of resist 3 are distributed with a constant gradient. As a result, the degree of crosslinking of resist 3 is also distributed with a constant gradient. FIG. 3A schematically illustrates component 20 in which a crosslinking reaction proceeds. As illustrated in FIG. 3A, a degree of crosslinking at position A of resist 3 is higher than a degree of crosslinking at position B of resist 3.

Thereafter, as illustrated in FIG. 3B, imprint mold 5 is cooled to temperature $T_2$ of semiconductor element 1. After cooling, the temperatures at position A and position B of resist 3, temperature $T_1$ of imprint mold 5, and temperature $T_2$ of semiconductor element 1 become equal.

After imprint mold 5 is peeled off from resist 3, resist 3 is immersed in the developer. By doing this, a portion having a low degree of crosslinking at position B of resist 3 is dissolved in the developer faster than a portion having a high degree of crosslinking at position A. As a result, an opening having a reverse tapered shape in which an opening width is widened toward electrode terminal (2) is formed in developed resist 3.

Here, when the transmittance of imprint mold 5 is between 50% and 80% (inclusive), it is suitable for forming the opening into the reverse tapered shape. For example, when imprint mold 5 is made of, for example, a resin containing a dye component, the transmittance is suitably reduced. Furthermore, when a metal film is formed on the surface of imprint mold 5 by vapor deposition, sputtering, spray coating, or the like, the transmittance of imprint mold 5 is suitably reduced. By reducing the transmittance to 80% or less, it is possible to prevent scattering leaking via protrusions 5a at the time of light irradiation and promotion of the degree of crosslinking around the opening due to reflected light from electrode terminal 2, and it is possible to form a distribution of the degree of crosslinking in the thickness direction. On the other hand, when the transmittance of imprint mold 5 is less than 50%, since a photoreaction time becomes long, a difference in the degrees of crosslinking between position A and position B of resist 3 becomes small, and a taper angle of the opening of resist 3 can be set to be close to 90°.

Note that, in the steps illustrated in FIGS. 3A and 3B, although resist 3 is irradiated with ultraviolet light 12 through imprint mold 5, even when resist 3 is directly irradiated with ultraviolet light 12 without imprint mold 5, the light reception amount of resist 3 in the thickness direction can be similarly distributed with a constant gradient. Furthermore, although the temperature of imprint mold 5 is increased and the temperature of resist 3 in the thickness direction is distributed with a constant gradient by thermal radiation from imprint mold 5, resist 3 is directly irradiated with thermal energy (for example, lamp heating or the like), and thus, the temperature of resist 3 in the thickness direction can be distributed with a constant gradient. As a result, the degree of crosslinking of resist 3 can be distributed with a constant gradient.

Furthermore, after resist 3 is irradiated with ultraviolet light 12, a step of heating resist 3 may not be performed in order to provide a constant temperature gradient in the thickness direction of resist 3. In this case, the light reception amount of resist 3 in the thickness direction can have a constant gradient by adjusting an irradiation amount of ultraviolet light 12, and as a result, the degree of crosslinking of resist 3 can be distributed with a constant gradient.

EXAMPLES

Resist 3 was formed on the surface of semiconductor element 1 on which the plurality of electrode terminals 2 were formed. Propylene glycol monomethyl ether acetate (PGMEA) was used as resist 3. The opening was formed in resist 3 by inserting the plurality of protrusions 5a provided in imprint mold 5 into resist 3 immediately above electrode terminal 2. Polydimethylsiloxane (PDMS) was used for imprint mold 5, and a fluorine-based mold release film having a thickness of 1 μm was formed on the inner surface of imprint mold 5. Here, a transmittance of PDMS at a wavelength of 365 nm is 80%.

Subsequently, after resist 3 was irradiated with ultraviolet rays having a wavelength of 365 nm, temperature $T_2$ of semiconductor element 1 was set to 70° C., and temperature $T_1$ of imprint mold 5 was increased to 120° C. Thereafter, when imprint mold 5 was peeled off from resist 3, opening 3a having an opening diameter of 3 μm was formed in resist 3.

Subsequently, after resist 3 was subjected to a developing treatment, opening 3a was filled with copper by using a plating method. Thereafter, resist 3 was peeled off from a surface of electrode terminal 2. Accordingly, bump 8 having a shape having tapered portion 8a in which a width of a bottom portion was 6 μm, reverse tapered portion 8b in which a width of a top portion was 4 μm, and recessed portion 8c in which a minimum width of a recess between tapered portion 8a and reverse tapered portion 8b was 1 μm was formed.

<Resist Opening Step by Step-and-Repeat Method>

A method of performing the resist opening step by the step-and-repeat method will be described with reference to FIGS. 4A to 4C.

Figure 4A:
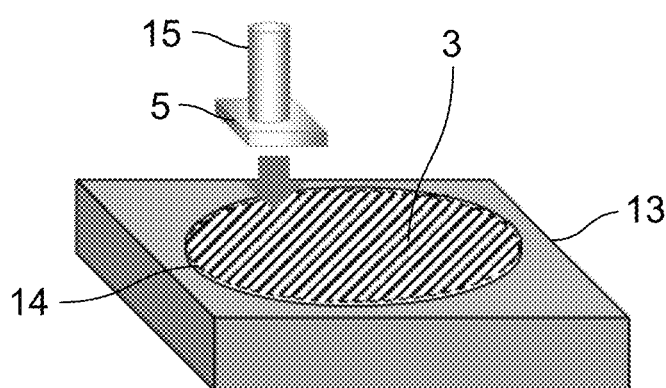
FIG. 4A is a diagram illustrating a resist opening step by a step-and-repeat method.

As illustrated in FIG. 4A, semiconductor wafer 14 on which resist 3 is formed is mounted on mounting stage 13. The opening is formed in resist 3 by aligning semiconductor wafer 14 and imprint mold 5, moving imprint mold 5 to a designated position on semiconductor wafer 14 by imprint head 15, and pushing imprint mold 5 into resist 3.

Figure 4B:
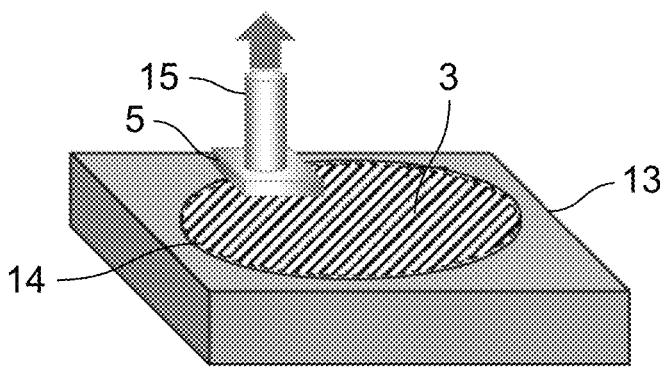
FIG. 4B is a diagram illustrating the resist opening step by the step-and-repeat method.

Thereafter, as illustrated in FIG. 4B, imprint head 15 is pulled up to peel off imprint mold 5 from resist 3. By reducing the size of imprint mold 5, the pattern accuracy of the mold is improved. Further, since a resistance at the time of mold releasing is reduced, resist peeling can be prevented.

Figure 4C:
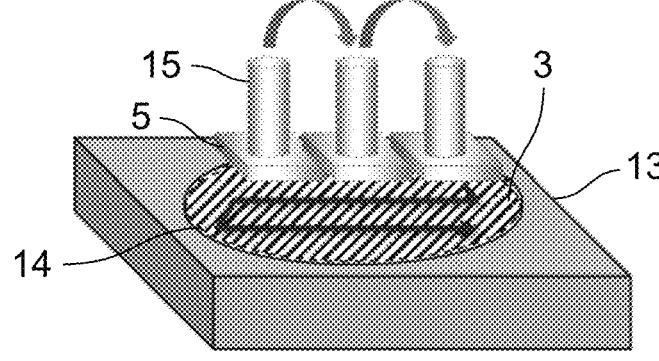
FIG. 4C is a diagram illustrating the resist opening step by the step-and-repeat method.

Furthermore, as illustrated in FIG. 4C, the opening of resist 3 is formed on the entire surface by the step-and-repeat method for repeatedly performing operations from alignment to releasing on adjacent patterns. Imprint mold 5 used at this time is suitably about 20 mm to 50 mm on one side from the viewpoint of productivity and shape stability, but is not limited thereto. By this method, it is possible to form the opening of resist 3 stably with high accuracy, and it is possible to realize production with a high yield even in large semiconductor wafer 14 having a size of 300 mm.

According to one aspect of the present disclosure, it is possible to provide a method for manufacturing a semiconductor device and a semiconductor device capable of alleviating stress applied to a mounting substrate side when a semiconductor element including a plurality of electrode terminals is flip-chip mounted on the mounting substrate.

What is claimed is:

1. A method for manufacturing a semiconductor device, the method comprising:

providing a semiconductor element having electrode terminals;

forming a resist on the semiconductor element, the resist having a first surface facing the electrode terminals and a second surface opposite to the first surface;

forming an opening in the resist, which covers the electrode terminals, by inserting protrusions of a mold into the resist above the electrode terminals;

curing the resist by applying energy to the resist; and widening the opening in a radial direction of the opening, wherein:

the curing of the resist is performed in a state where the second surface of the resist faces an inner surface of the mold with a gap between the second surface of the resist and the inner surface of the mold; and in the forming of the opening in the resist, a raised portion of the resist is formed along an opening peripheral edge of the opening.

2. The method according to claim 1, wherein, in the widening of the opening, the opening is formed in a reverse tapered shape in which an opening width of the opening is widened toward one of the electrode terminals.

3. The method according to claim 1, further comprising:

forming a bump by filling the opening with metal after the forming of the opening in the resist; and peeling off the resist from the electrode terminals, wherein, in the forming of the bump, the metal is filled up to the raised portion.

4. The method according to claim 1, further comprising:

forming a seed layer that covers a surface of one of the electrode terminals before the forming of the resist, wherein, in the forming of the resist, the resist is formed on the seed layer.

5. The method according to claim 1, wherein the forming of the opening in the resist is performed by a step-and-repeat method.

6. The method according to claim 1, wherein, in the curing of the resist, the energy is applied to the resist via the mold.

7. The method according to claim 6, wherein the energy is applied to the resist by irradiation of the mold with ultraviolet light, and a light transmittance of the mold is lower than a light transmittance of the resist.

8. The method according to claim 1, wherein the widening of the opening in the radial direction of the opening is performed by causing the resist to react with a developer after the curing of the resist.

9. A method for manufacturing a semiconductor device, the method comprising:

forming an opening in a resist, which covers electrode terminals formed in the semiconductor device, by inserting protrusions of a mold into the resist above the electrode terminals;

curing the resist by applying energy to the resist; and widening the opening in a radial direction of the opening, wherein:

the forming of the opening in the resist is performed in a state where a gap is between a surface of the resist and an inner surface of the mold; and in the forming of the opening in the resist, a raised portion of the resist is formed along an opening peripheral edge of the opening.

10. The method according to claim 9, further comprising:

forming a bump by filling the opening with metal after the forming of the opening in the resist; and peeling off the resist from the electrode terminals, wherein, in the forming of the bump, the metal is filled up to the raised portion.

* * * * *